(12) United States Patent
Takahashi et al.

(10) Patent No.: US 9,190,604 B2
(45) Date of Patent: Nov. 17, 2015

(54) MANUFACTURING METHOD FOR THIN BOARD-SHAPED FIRED PIEZOELECTRIC BODY

(75) Inventors: Nobuo Takahashi, Kasugai (JP); Takao Ohnishi, Niwa-Gun (JP)

(73) Assignee: NGK Insulators, Ltd., Nagoya (JP)

( * ) Notice: Subject to any disclaimer, the term of this patent is extended or adjusted under 35 U.S.C. 154(b) by 1021 days.

(21) Appl. No.: 13/273,608

(22) Filed: Oct. 14, 2011

(65) Prior Publication Data

US 2012/0030916 A1 Feb. 9, 2012

Related U.S. Application Data

(63) Continuation of application No. PCT/JP2010/057258, filed on Apr. 23, 2010.

(30) Foreign Application Priority Data

Apr. 24, 2009 (JP) .................................. 2009-106663

(51) Int. Cl.
| | |
|---|---|
| *H01L 41/25* | (2013.01) |
| *H01L 41/273* | (2013.01) |
| *H01L 41/053* | (2006.01) |
| *H01L 41/29* | (2013.01) |

(Continued)

(52) U.S. Cl.
CPC ............ *H01L 41/273* (2013.01); *H01L 41/053* (2013.01); *H01L 41/29* (2013.01); *H01L 41/33* (2013.01); *H01L 41/338* (2013.01); *H01L 41/35* (2013.01); *H01L 41/43* (2013.01); *C04B 35/62222* (2013.01); *C04B 35/634* (2013.01); *H01L 21/481* (2013.01); *H01L 21/4807* (2013.01); *Y10T 29/42* (2015.01); *Y10T 29/49005* (2015.01); *Y10T 29/49126* (2015.01); *Y10T 29/49165* (2015.01)

(58) Field of Classification Search
CPC ..... H01L 41/053; H01L 41/273; H01L 41/29; H01L 41/33; H01L 41/338; H01L 41/35; H01L 41/43; H01L 21/4807; H01L 21/481; C04B 35/62222; C04B 35/634
USPC ............... 29/25.35, 594, 830, 852; 156/89.11
See application file for complete search history.

(56) References Cited

U.S. PATENT DOCUMENTS

| | | |
|---|---|---|
| 5,755,019 A | 5/1998 | Naka et al. |
| 5,786,833 A | 7/1998 | Naka et al. |

(Continued)

FOREIGN PATENT DOCUMENTS

| | | |
|---|---|---|
| EP | 0 667 646 A1 | 8/1995 |
| EP | 0 667 647 A1 | 8/1995 |

(Continued)

*Primary Examiner* — A. Dexter Tugbang
(74) *Attorney, Agent, or Firm* — Burr & Brown, PLLC

(57) ABSTRACT

A manufacturing method for a thin board-shaped fired piezoelectric body has: a step of manufacturing, using a piezoelectric material, a green sheet having a ratio T/L of 0.000002 to 0.2, where T is the thickness and L is the maximum length within the surface after firing; and a step of obtaining the thin board-shaped fired piezoelectric body with reinforcing members for firing by performing firing after disposing the reinforcing members for firing by scattering at least on one surface of the green sheet so as to exclude the areas to be the thin board-shaped fired piezoelectric body later. The piezoelectric body which has excellent planarity and a thin board shape can be manufactured at low cost by the method.

22 Claims, 4 Drawing Sheets

(51) Int. Cl.
*H01L 41/33* (2013.01)
*H01L 41/35* (2013.01)
*H01L 41/338* (2013.01)
*H01L 41/43* (2013.01)
*C04B 35/622* (2006.01)
*H01L 21/48* (2006.01)
*C04B 35/634* (2006.01)

(56) References Cited

U.S. PATENT DOCUMENTS

| | | |
|---|---|---|
| 5,809,626 A | 9/1998 | Takeuchi et al. |
| 2004/0163225 A1* | 8/2004 | Ikeda et al. ............... 29/25.35 |
| 2005/0057120 A1 | 3/2005 | Nanataki et al. |
| 2005/0082946 A1 | 4/2005 | Takeuchi et al. |
| 2005/0263238 A1* | 12/2005 | Takase et al. ............... 156/89.11 |
| 2005/0285480 A1 | 12/2005 | Hida et al. |
| 2006/0197413 A9 | 9/2006 | Takeuchi et al. |

FOREIGN PATENT DOCUMENTS

| | | |
|---|---|---|
| EP | 0 671 772 A1 | 9/1995 |
| EP | 0 843 367 A2 | 5/1998 |
| JP | 06-061364 A1 | 3/1994 |
| JP | 06334236 A * | 12/1994 |
| JP | 07-148923 A1 | 6/1995 |
| JP | 08-051238 A1 | 2/1996 |
| JP | 09-229013 A1 | 9/1997 |
| JP | 2003-347452 A1 | 12/2003 |
| JP | 2005-057250 A1 | 3/2005 |
| JP | 2006-014557 A1 | 1/2006 |

* cited by examiner (1)

(2)

(3)

(4)

(1)

(2)

(3)

(4)

(5)

MANUFACTURING METHOD FOR THIN BOARD-SHAPED FIRED PIEZOELECTRIC BODY

BACKGROUND OF THE INVENTION

1. Field of the Invention

The present invention relates to a manufacturing method for a thin board-shaped piezoelectric body having both the surfaces formed of fired surfaces and having excellent planarity.

2. Description of Related Art

Recently, there has been desired a displacement control device capable of adjusting the optical path length and the position in sub-micrometer in the fields of optics, precision machinery, semi-conductor manufacturing, etc. In response to this, development of piezoelectric devices is proceeding. The piezoelectric devices are a piezoelectric actuator utilizing strain (deformation) based on the reverse piezoelectric effect and the like caused upon applying an electric field to a ferroelectric body or an antiferroelectric body, a piezoelectric sensor utilizing charge generation caused upon applying stress to the ferroelectric body/antiferroelectric body on the basis of a similar effect, and the like. The core of these piezoelectric devices is a fired piezoelectric body and a piezoelectric element obtained by holding the piezoelectric body between electrodes.

The fired piezoelectric body (fired piezoelectric body) can be manufactured by firing at high temperature. The fired piezoelectric body can obtain large displacement with a high piezoelectric constant by appropriately selecting the kinds of additives. Since the piezoelectric element constituted of such a fired piezoelectric body can obtain large displacement even when it is small, it is suitably employed as a drive portion of the aforementioned displacement control device.

There are the following Patent Documents 1 and 2 as the prior art documents regarding a manufacturing method for a piezoelectric body.

PRIOR ART DOCUMENT

Patent Document

Patent Document 1: JP-A-8-051238
Patent Document 2: JP-A-9-229013

SUMMARY OF THE INVENTION

However, conventional methods for manufacturing a piezoelectric body have the following problems. That is, in the case that the piezoelectric body has a thin board-like shape formed of one layer or a few layers and having an entire thickness of 20 μm or less, since it has large deformation by firing, a piezoelectric body having high planarity cannot be obtained. In addition, because of the deformation, a crack is easily caused upon handling it. In addition, the amount of materials to be discarded is large, and there is a case that an expensive die or the like has to be used.

Specific problems based on the prior art documents will be described. In the first place, the aforementioned Patent Document 1 discloses a manufacturing method for a diaphragm structure having a two-layer structure where the second layer has a window shape (closed space). In the Patent Document 1, upon firing with putting the structure on a setter or the like, since the firing atmosphere is different between the front surface and the back surface of the diaphragm portion of the first layer, there is fear that a fine difference is caused in a sintering state to make the diaphragm portion to fail to obtain a desired shape.

Next, the aforementioned Patent Document 2 discloses a manufacturing method for a multi-diaphragm structure, where formation of the second layer out of the three layers by printing is described. The multi-diaphragm structure is manufactured in such a manner that the first layer is a vibration plate, that the second layer is subjected to patterning by printing (forming of a closed space), and that the third layer is a substrate having a through-hole formed therein. The diaphragm is formed in the first and second layers, and the through-hole in the third layer communicates with the outside. In such a manufacturing method for a multi-diaphragm structure, since the third layer is present, there is fear that it becomes a portion which is not used as a product later to increase the amount of materials to be discarded. In addition, since a through-hole is formed in the third layer, there is fear that the formation of the through-hole itself increases the costs as the density of the piezoelectric element is raised and as the number of the piezoelectric elements taken out increases in the manufacturing proceeds in accordance with the high densification.

By examining the Patent Document 2, in the first place, since the printing pattern in the second layer has an opening in at least one portion in the same plane, it can be considered that the third layer is unnecessary. In addition, if the first layer (thin board portion) is cut out after firing, since the portion other than the portion cut out is to be discarded, it can be considered that the amount of materials to be discarded can be reduced. Further, if the third layer is used for reinforcement in order to improve the planarity of the thin board portion, since the through-hole becomes unnecessary, and the use of a die for forming the through-hole becomes unnecessary, it can be considered that the number of steps can be reduced.

The present invention has been made through repeated further study in addition to the aforementioned examination and aims to provide a means for manufacturing a thin board-shaped piezoelectric body having excellent planarity at low costs. As a result of the examination and study, it has been found out that the aforementioned problems can be solved and that a thin board-shaped fired piezoelectric body excellent in planarity can be obtained at low costs by bonding remote island-shaped reinforcing members for firing to a green sheet which becomes a piezoelectric body in order to inhibit deformation upon firing and cutting out a thin plate portion which is not the reinforcing member portion for firing (originally green sheet) after firing.

That is, in the first place, according to the present invention, there is provided a manufacturing method for a thin board-shaped fired piezoelectric body, the method comprising: a step of manufacturing, using a piezoelectric material, a green sheet having a thickness T after firing of 0.1 μm to 20 μm and a ratio T/L of 0.000002 to 0.2, where L is the maximum length within the surface after firing; and a step of obtaining the thin board-shaped fired piezoelectric body with reinforcing members for firing by performing firing after disposing the reinforcing members for firing by scattering (the reinforcing members for firing) at least on one surface of the green sheet so as to exclude the areas to be the thin board-shaped fired piezoelectric body later.

Since the reinforcing members for firing are disposed at least on one surface, it may be disposed on both the surfaces of the green sheet.

As described later, a thin board-shaped fired piezoelectric body can be obtained by removing the reinforcing members for firing from the thin board-shaped fired piezoelectric body with reinforcing members for firing after firing.

Since the thickness T and the maximum length L within the surface of the green sheet shrink by the firing at high temperature, the thickness T and the maximum length L within the surface of the green sheet may be determined in consideration of the shrinkage ratio on the basis of the thickness and the maximum length within the surface of the thin board-shaped fired piezoelectric body to be obtained.

The green sheet is a sheet formed of a piezoelectric ceramic material before firing including the areas which become a thin board-shaped fired piezoelectric body later. The reinforcing members for firing are substantially a sheet (green sheet) formed of a ceramic material before firing like the green sheet. Though the ceramic material for the reinforcing members for firing may be the same as or different from the piezoelectric ceramic members of the green sheet which becomes a thin board-shaped fired piezoelectric body, the same material is preferable in the case of trying to obtain the body having higher planarity.

In a manufacturing method for a thin board-shaped fired piezoelectric body of the present invention, the ratio T/L is preferably 0.001 to 0.06.

In a manufacturing method for a thin board-shaped fired piezoelectric body of the present invention, the reinforcing members for firing are scattered and disposed at least on one surface of the green sheet. As they are scattered, the reinforcing members for firing are plural. Scattering means that they are present independently and separately as remote islands. A preferable scattering mode is specifically as follows.

That is, in a manufacturing method for a thin board-shaped fired piezoelectric body of the present invention, it is preferable to scatter the reinforcing members for firing at least on one surface of the green sheet to be symmetrical about a point (point-symmetry). To scatter them to be symmetrical about a point means that (the shape of) the disposition of plural reinforcing members for firing selected from the entire reinforcing members for firing scattered have a symmetrical point and that, even if it is rotated 180 degrees around the symmetrical point, (the shape of) the disposition is not changed.

In a manufacturing method for a thin board-shaped fired piezoelectric body of the present invention, it is preferable that the reinforcing members for firing are scattered at least on one surface of the green sheet in a shape where a continued lattice shape is segmentalized to remove parts (of the lattice shape). Such a mode is preferably employed in the case of taking out many thin board-shaped fired piezoelectric bodies by the use of a large number of reinforcing members for firing.

In a manufacturing method for a thin board-shaped fired piezoelectric body of the present invention, it is preferable that the reinforcing members for firing are formed by screen printing to dispose the reinforcing members for firing at least on one surface of the green sheet.

In a manufacturing method for a thin board-shaped fired piezoelectric body of the present invention, it is preferable that, after the reinforcing members for firing are scattered and disposed on a reinforcing plate for firing which is thicker than the green sheet in advance, the surface having the reinforcing members for firing disposed thereon of the reinforcing plate for firing is bonded to the green sheet to dispose the reinforcing members for firing at least on one surface of the green sheet.

In a manufacturing method for a thin board-shaped fired piezoelectric body of the present invention, the reinforcing members for firing are preferably thicker than the green sheet. For example, if the green sheet has a thickness of 10 μm, the reinforcing members for firing have a thickness of above 10 μm, and it is preferably several tens micrometers (e.g., 50 μm to 90 μm). The thickness may be several hundreds micrometers.

In a manufacturing method for a thin board-shaped fired piezoelectric body of the present invention, it is preferable that, after the step of obtaining the thin board-shaped fired piezoelectric body with the reinforcing members for firing, the method has a step of obtaining the thin board-shaped fired piezoelectric body by removing the reinforcing members for firing from the thin board-shaped fired piezoelectric body with the reinforcing members for firing by cutting, and that the cutting method is one selected from the cutting means consisting of a grinding stone method, a water jet method, an etching method, and a sandblasting method.

Next, according to the present invention, there is provided a manufacturing method for a piezoelectric element, the method having: a step of obtaining a thin board-shaped fired piezoelectric body with the reinforcing members for firing using the aforementioned manufacturing method for a thin board-shaped fired piezoelectric body (without the step of obtaining the thin board-shaped fired piezoelectric body by removing the reinforcing members for firing from the thin board-shaped fired piezoelectric body with the reinforcing members for firing by cutting, and having the prior steps), and a step of forming a membrane-shaped electrode on the areas to be a thin board-shaped fired piezoelectric body later in the thin board-shaped fired piezoelectric body with the reinforcing members for firing.

In a manufacturing method for a thin board-shaped fired piezoelectric body of the present invention, it is preferable that the membrane-shaped electrode is formed by a method selected from the membrane formation means consisting of a spin coat method, a sputtering method, a dipping method, and a non-contact application method.

In a manufacturing method for a thin board-shaped fired piezoelectric body of the present invention, it is preferable that the method has a step of obtaining a piezoelectric element by removing the reinforcing members for firing from the thin board-shaped fired piezoelectric body with the reinforcing members for firing having a membrane-shaped electrode formed thereon by cutting, and that the cutting method is one selected from the cutting means consisting of a grinding stone method, a water jet method, an etching method, and a sandblasting method.

In a manufacturing method for a thin board-shaped fired piezoelectric body of the present invention, since a green sheet having a thickness T after firing of 0.1 μm to 20 μm and a ratio T/L of the thickness T to the maximum length L within the surface of 0.000002 to 0.2 is manufactured using a piezoelectric material, and firing is performed after disposing the reinforcing members for firing by scattering the reinforcing members at least on one surface of the green sheet, excluding the areas to be the thin board-shaped fired piezoelectric body later, there arises no difference locally in the atmosphere upon firing by the scattering of the reinforcing members for firing, the atmosphere in the vicinity of the green sheet can easily be uniformalized, and a thin board-shaped fired piezoelectric body having the same sintering state between the front surface and the back surface can be obtained. As a result, it becomes possible to obtain a thin board-shaped piezoelectric body having excellent planarity. In addition, in a manufacturing method for a piezoelectric element of the present invention, firing is performed after disposing the reinforcing members for firing by scattering the reinforcing members at least on one surface of the green sheet, excluding the areas to be the thin board-shaped fired piezoelectric body later, and then the electrode is fired further. Since the amount of deformation due to the heat upon the firing can be reduced, it becomes possible to obtain a piezoelectric element having a thin board-shaped piezoelectric body having excellent planarity. The planarity means the size of deviation from the geometric plane of the surface, which should be a plane, of the thin board-shaped fired piezoelectric body.

In a manufacturing method for a thin board-shaped fired piezoelectric body of the present invention, particularly, by disposing reinforcing members for firing to be symmetrical with respect to the green sheet on both the surfaces in the case that the reinforcing members for firing are disposed on both the surfaces of the green sheet, there can be obtained a thin board-shaped fired piezoelectric body having little difference in the sintering state between the front surface and the back surface in comparison with the case that such disposition is not employed.

In a manufacturing method for a thin board-shaped fired piezoelectric body of the present invention, since the reinforcing members for firing are scattered at least on one surface of the green sheet to be symmetrical about a point in a preferable mode, the stress applied to the green sheet (thin board-shaped fired piezoelectric body) upon firing becomes symmetrical about a point to be able to reduce generation of local deformation.

In a manufacturing method for a thin board-shaped fired piezoelectric body of the present invention, since the reinforcing members for firing are formed by screen printing in a preferable mode, various patterns of the reinforcing members for firing can be realized at low costs. The pattern of the reinforcing members for firing means one of or both the shape of the reinforcing members for firing and the disposition mode of the reinforcing members for firing.

In a manufacturing method for a thin board-shaped fired piezoelectric body of the present invention, in a preferable mode, after the reinforcing members for firing are scattered and disposed on a reinforcing plate for firing which is thicker than the green sheet in advance, the surface having the reinforcing members for firing disposed thereon of the reinforcing plate for firing is bonded to the green sheet to dispose the reinforcing members for firing at least on one surface of the green sheet. Since they are then fired, the green sheet and the reinforcing plate for firing are fired in the state where they are connected by means of the reinforcing members for firing held between them. Therefore, it is possible to reduce the warpage of the whole including the green sheet, the reinforcing plate for firing, and the reinforcing members for firing held between them.

In a manufacturing method for a thin board-shaped fired piezoelectric body of the present invention, in a preferable mode, since the reinforcing members for firing are thicker than the green sheet, the rigidity can be made higher than a case that the reinforcing members are thinner than the green sheet, and the warpage upon firing can be reduced.

DETAILED DESCRIPTION OF THE INVENTION

Figure 1:
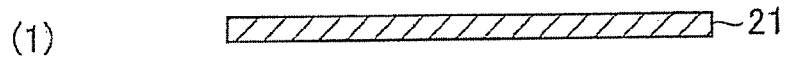
FIG. 1 is a cross-sectional view showing an embodiment of a manufacturing method for a thin board-shaped fired piezoelectric body of the present invention, showing the steps (1) to (4).
Figure 1:
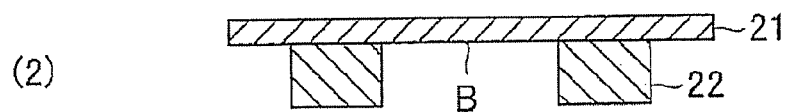
Figure 1:
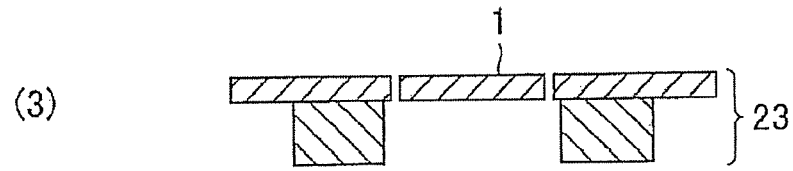
Figure 1:

Hereinbelow, embodiments of the present invention will be described with appropriately referring to drawings. However, the present invention should not be construed with limiting to these embodiments, and various changes, modifications, and improvements may be made on the basis of knowledge of a person of ordinary skill as long as they do not deviate from the scope of the present invention. For example, though the drawings show suitable embodiments of the present invention, the present invention is not limited by the modes shown in the drawings and the information shown in the drawings. In carrying out or examining the present invention, though the same means as a means described in the present specification or a means equivalent to a means described in the present specification can be employed, a suitable means is the means described below.

In the first place, an embodiment of a manufacturing method for a thin board-shaped fired piezoelectric body of the present invention will be described with referring to FIGS. 1 to 4C. Incidentally, FIG. 1 was drawn as a view for obtaining one thin board-shaped fired piezoelectric body (the others were omitted), and FIGS. 3A and 3B were drawn as views for obtaining nine thin board-shaped fired piezoelectric bodies. In a manufacturing method for a thin board-shaped fired piezoelectric body of the present invention, needless to say, nine or more articles can be taken, and a few to several hundreds thin board-shaped fired piezoelectric bodies can be produced from one green sheet.

Figure 2:
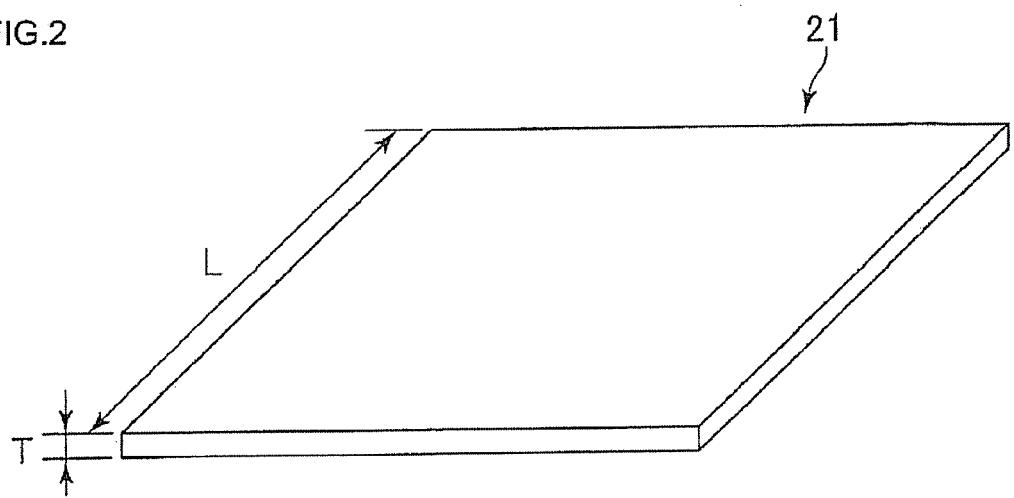
FIG. 2 is a perspective view showing an embodiment of a manufacturing method for a thin board-shaped fired piezoelectric body of the present invention, showing a green sheet to be used.

In the first place, a green sheet 21 is manufactured by the use of a piezoelectric material (see the step (1) of FIG. 1 and FIG. 2). The green sheet 21 has a thin board shape having a single layer, a thickness T of 0.1 μm to 20 μm, and a ratio T/L of the thickness T to the maximum length L within the surface of 0.000002 to 0.2. Specifically, for example, slurry is prepared by adding a binder, a solvent, a dispersant, a plasticizer, and the like to a ceramic powder of lead zirconate titanate or the like and mixing them; and, after the slurry is subjected to a defoaming treatment, a green sheet having the aforementioned thickness is manufactured by a method such as a reverse roll coater method or a doctor blade method. Then, by a method such as punching using a die, laser processing, and the like, the green sheet 21 having a size having the aforementioned ratio of the thickness to the maximum length within the surface can be obtained.

Though the plane shape of the green sheet 21 including the areas to be the thin board-shaped fired piezoelectric body later is rectangular as shown in FIG. 2, the outer shape of the green sheet is not particularly limited in a manufacturing method for a thin board-shaped fired piezoelectric body of the present invention. Since the productivity can be improved, an outer shape capable of being machined is desirable. In consideration of the productivity, a shape formed by straight lines, for example, a polygon, in particular, a rectangle is preferable.

Figure 3A:
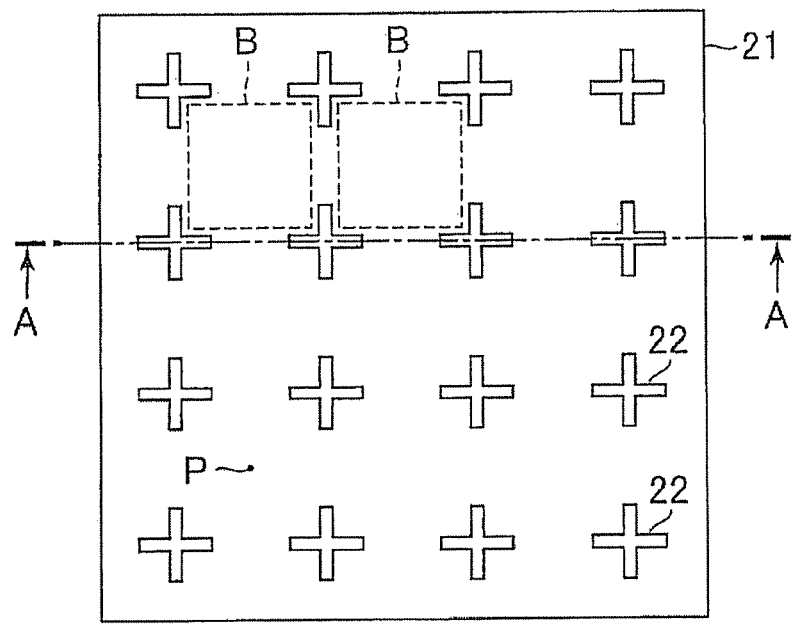
FIG. 3A is a back view showing an embodiment of a manufacturing method for a thin board-shaped fired piezoelectric body of the present invention, showing a thin board-shaped fired piezoelectric body with reinforcing members for firing obtained in the manufacturing process.
Figure 3B:
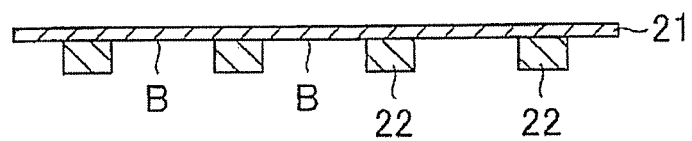
FIG. 3B is a cross-sectional view showing the AA cross section shown in FIG. 3A, with the front surface on the upper side and the back surface (surface shown in FIG. 3A) on the lower side.

Next, the reinforcing members 22 for firing scattered so as to exclude the areas to be the thin board-shaped fired piezoelectric body later (see the step (2) of FIG. 1, FIG. 3A, and FIG. 38) are formed and disposed by (for example) screen printing on one surface (e.g., lower surface (back surface)) of the green sheet 21. The B areas surrounded by the square formed of broken lines of FIG. 3A are the area to be the thin board-shaped fired piezoelectric body later. Specifically, for example, a binder, a solvent, a dispersant, a plasticizer, and the like are added to the same ceramic powder of lead zirconate titanate or the like, and they are mixed together to produce a paste, which is subjected to a defoaming treatment. Then, the paste is printed on a surface of the green sheet 21 by the use of a screen printer (plate making for screen printing), a thick printed membrane is formed to have a desired pattern and fired to obtain reinforcing members 22 for firing. In addition, it is also possible that a pattern is formed on a tape and then transcribed.

Figure 4A:
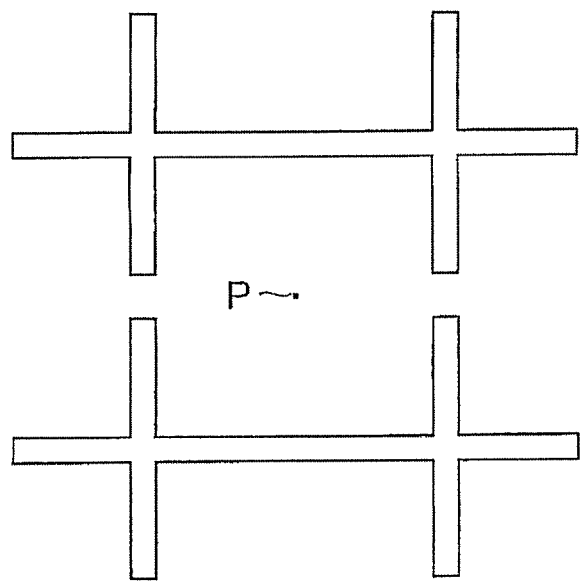
FIG. 4A is a view showing an example of a pattern of the reinforcing members for firing.
Figure 4B:
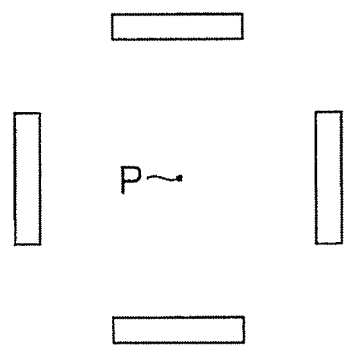
FIG. 4B is a view showing another example of a pattern of the reinforcing members for firing.
Figure 4C:
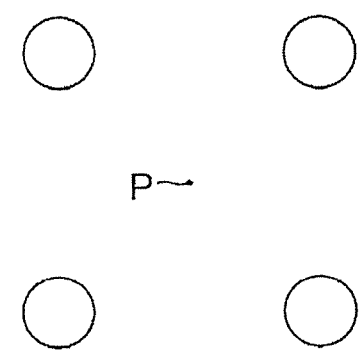
FIG. 4C is a view showing another example of a pattern of the reinforcing members for firing.

The pattern of the reinforcing members 22 for firing (printed membrane) may be a pattern where cross-shaped reinforcing members 22 for firing are disposed at regular intervals as shown in FIG. 3A, a pattern where reinforcing members 22 for firing each having a shape of two connected crosses are disposed as shown in FIG. 4A, a pattern where two pairs of stick-shaped reinforcing members for firing are disposed in parallel with each other to face each other as shown in FIG. 4B, or a pattern where circular reinforcing members for firing are disposed in positions corresponding to the vertices of a square as shown in FIG. 4C. In any of the patterns, the areas to be a thin board-shaped fired piezoelectric body later are secured as a square or a rectangle, and four or two reinforcing members for firing are disposed to be symmetrical about a point to have a symmetrical point P. Such disposition also has a shape where a (continued) lattice shape is segmentalized to remove parts of it.

Then, after the reinforcing members 22 for firing are bonded to the green sheet 21, firing is performed at appropriate temperature within the range from 800° C. to 1600° C. on the basis of the piezoelectric material to be used to obtain a thin board-shaped fired piezoelectric body 23 with reinforcing members for firing. Then, the reinforcing members for firing is removed from the thin board-shaped fired piezoelectric body with the reinforcing members for firing by cutting by a mechanical method such as a grinding stone method, a water jet method, and a sandblasting method or a chemical method such as an etching method to obtain a thin board-shaped fired piezoelectric body 1 (see the steps (3) and (4) of FIG. 1).

Next, another embodiment of a manufacturing method for a thin board-shaped fired piezoelectric body of the present invention will be described with referring to FIG. 5. In the first place, a reinforcing plate 51 for firing thicker than the green sheet 21 shown later is prepared (see the step (1) of FIG. 5). For example, the reinforcing plate 51 for firing is preferably formed in advance by a tape forming method such as a doctor blade method or formed by a screen printing method by the use of the same material as that for the reinforcing members 22 for firing or a material having a composition close to that of the material for the reinforcing members 22 for firing. Next, the reinforcing members 22 for firing scattered on one surface (e.g., upper surface (front surface)) of the reinforcing plate 51 for firing so as to exclude the areas to be the thin board-shaped fired piezoelectric body later of the green sheet 21 are formed by (for example) a screen printing method and disposed (see the step (2) of FIG. 5). Specifically, for example, a binder, a solvent, a dispersant, a plasticizer, and the like are added to a ceramic powder of lead zirconate titanate or the like, and they are mixed together to produce a paste, which is subjected to a defoaming treatment. Then, the paste is printed on a surface of the reinforcing plate 51 for firing by the use of a screen printer (plate making for screen printing), and the thick printed membrane is formed in a desired pattern and fired to obtain reinforcing members 22 for firing.

In addition, a green sheet 21 is manufactured separately by the use of a piezoelectric material. The green sheet 21 has a thin board shape having a single layer, a thickness T of 0.1 μm to 20 μm, and a ratio T/L of the thickness T to the maximum length L within the surface of 0.000002 to 0.2. Specifically, for example, slurry is prepared by adding a binder, a solvent, a dispersant, a plasticizer, and the like to a ceramic powder of lead zirconate titanate or the like and mixing them; and, after the slurry is subjected to a defoaming treatment, a green sheet having the aforementioned thickness is manufactured by a method such as a reverse roll coater method or a doctor blade method. Then, by a method such as punching using a die, laser processing, and the like, the green sheet 21 having a size having the aforementioned ratio of the thickness to the maximum length within the surface can be obtained.

Figure 5:
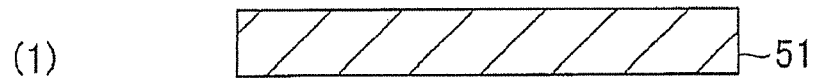
FIG. 5 is a cross-sectional view showing another embodiment of a manufacturing method for a thin board-shaped fired piezoelectric body of the present invention, showing the steps (1) to (5).
Figure 5:
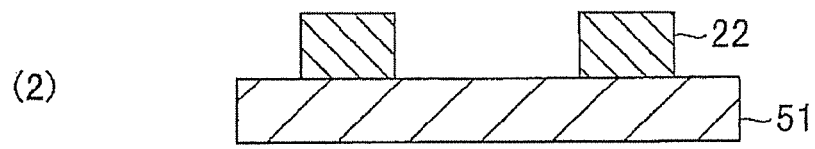
Figure 5:
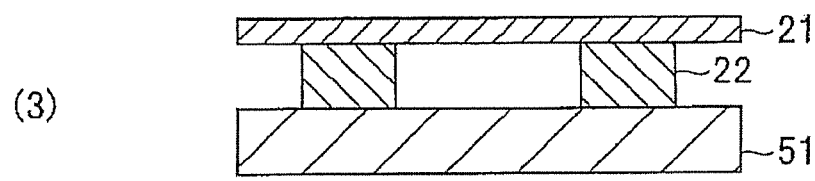
Figure 5:
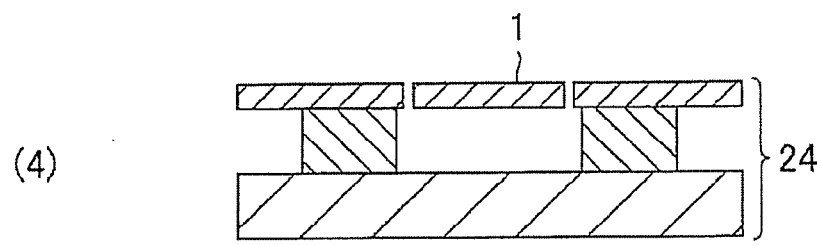
Figure 5:

Then, the surface where the reinforcing members 22 for firing are disposed ON the reinforcing plate 51 for firing is bonded to the green sheet 21 (see the step (3) of FIG. 5). The bonding is performed by pressure bonding by heating and applying load. Then by firing at appropriate temperature within the range from 800° C. to 1600° C. on the basis of the piezoelectric material to be used, there is obtained a thin board-shaped fired piezoelectric body 24 (provided) with reinforcing members for firing, where the reinforcing plate for firing is further provided. Then, the reinforcing plate for firing and the reinforcing members for firing are removed from the thin board-shaped fired piezoelectric body (provided) with the reinforcing members for firing, where the reinforcing plate for firing is further provided, by cutting by a mechanical method such as a grinding stone method, a water jet method, and a sandblasting method or a chemical method such as an etching method to obtain a thin board-shaped fired piezoelectric body 1 (see the steps (4) and (5) of FIG. 5).

Next, a manufacturing method for a piezoelectric element of the present invention will be described. A manufacturing method for a piezoelectric element of the present invention is a method using one of the aforementioned methods for manufacturing a thin board-shaped fired piezoelectric body of the present invention. The piezoelectric element means a thin board-shaped fired piezoelectric body having an electrode formed thereon. A manufacturing method for a piezoelectric element of the present invention is a method where a step of forming a membrane-shaped electrode in the areas to be a thin board-shaped fired piezoelectric body is added to a manufacturing method for a thin board-shaped fired piezoelectric body of the present invention. A piezoelectric element (a thin board-shaped fired piezoelectric body having an electrode formed thereon) can be obtained by obtaining a thin board-shaped fired piezoelectric body with reinforcing members for firing (or a thin board-shaped fired piezoelectric body (provided) with reinforcing members for firing, where a reinforcing plate for firing is further provided) by a manufacturing method for a thin board-shaped fired piezoelectric body of the present invention; before cutting, forming a membrane-shaped electrode in a portion to be a thin board-shaped fired piezoelectric body later by a membrane formation means such as a spin coat method, a sputtering method, a dipping method, or a non-contact application method; and then cutting to remove the reinforcing members for firing.

Next, the material used for the thin board-shaped fired piezoelectric body and the piezoelectric element will be described. In the first place, the material (piezoelectric material) for the thin board-shaped fired piezoelectric body will be described. There is no limitation on the material as long as the material causes an electric field induction strain of a piezoelectric effect, an electrostrictive effect, or the like. It is possible to use semiconductor ceramic, ferroelectric ceramic or antiferroelectric ceramic; and the material may suitably be selected in accordance with the use. In addition, the material may be a material requiring a polarization treatment or a material requiring no polarization treatment.

Specifically, suitable examples of the material include lead zirconate, lead titanate, lead magnesium niobate, lead nickel niobate, lead nickel tantalate, lead zinc niobate, lead manganese niobate, lead antimony stannate, lead manganese tungstate, lead cobalt niobate, lead magnesium tungstate, lead magnesium tantalate, barium titanate, sodium bismuth titanate, bismuth neodymium titanate (BNT), potassium sodium niobate, strontium bismuth tantalate, tungsten barium copper, bismuth ferrate, or a composite oxide of two or more kinds out of these. In addition, these Materials may contain, as solid solution substances, oxides of lantern, potassium, strontium, molybdenum, tungsten, barium, niobium, zinc, nickel, manganese, cerium, cadmium, chrome, cobalt, antimony, iron, yttrium, tantalum, lithium, bismuth, stannum, and copper. In selection of the material, though there is no particular limitation as long as the material satisfies necessary performance as a device, for example, a composite oxide of lead zirconate, lead titanate, lead magnesium niobate, and lead nickel niobate is preferable since high material properties can be exhibited. Further, a material where lithium bismuthate, lead germanate, or the like is added to the aforementioned material, for example, a material where lithium bismuthate or lead germanate is added is more preferable because it can exhibit high material properties with realizing low temperature firing of the piezoelectric body.

Incidentally, as the material for the reinforcing members for firing, the aforementioned piezoelectric material can be used. In order to make the extent of the thermal expansion the same, it is preferable to use the same material as the thin board-shaped fired piezoelectric body (green sheet).

In addition, as the material for the reinforcing plate for firing, the aforementioned piezoelectric material can be used. In order to make the extent of the thermal expansion, it is preferable to use the same material as the thin board-shaped fired piezoelectric body (green sheet) and the reinforcing members for firing.

Next, as the material for the electrode, there is employed conductive metal. It is preferable to use, for example, a metal simple substance such as aluminum, titanate, chrome, iron, cobalt, nickel, copper, zinc, niobium, molybdenum, ruthenium, palladium, rhodium, silver, stannum, tantalum, tungsten, iridium, platinum, gold, or lead; or alloy formed of two or more kinds of these substances, for example, silver-platinum, platinum-palladium, and silver-palladium; which may be used alone or as a combination of two or more kinds. In addition, the material may be a mixture of these materials with aluminum oxide, zirconium oxide, titanium oxide, silicon oxide, cerium oxide, glass, a piezoelectric material, or the like, or cermet. In selection of these materials, it is preferable to select the material in accordance with the kind of the piezoelectric material.

INDUSTRIAL APPLICABILITY

A thin board-shaped fired piezoelectric body of the present invention is suitably used as various piezoelectric actuators applied to a measuring equipments, an optical modulator, an optical switch, a micro valve, a carrier device, an image display device (display, projector, etc.), an image depiction device, a micro pump, a droplet ejection device, a micro mixer, a micro stirrer, and a micro reactor; or as the main constituent (displacement generation portion) of a piezoelectric element provided on various piezoelectric sensors used for detecting fluid properties, sound pressure, micro weight, acceleration, or the like.

DESCRIPTION OF REFERENCE NUMERALS

1: thin board-shaped fired piezoelectric body
21: green sheet
22: reinforcing member for firing
23: thin board-shaped fired piezoelectric body with reinforcing members for firing
24: thin board-shaped fired piezoelectric body (provided) with reinforcing members for firing (which is further provided with a reinforcing plate for firing)
51: reinforcing plate for firing

The invention claimed is:

1. A manufacturing method for a thin board-shaped fired piezoelectric body, the method comprising:
   a step of manufacturing, using a piezoelectric material, a green sheet having a ratio T/L of 0.000002 to 0.2, where T is the thickness and L is the maximum length within a surface of the green sheet after firing; and
   a step of obtaining the thin board-shaped fired piezoelectric body with reinforcing members for firing by the firing of the green sheet with the reinforcing members for firing on at least one surface of the green sheet after disposing the individual reinforcing members for firing by scattering on the at least one surface of the green sheet so as to exclude the areas to be the thin board-shaped fired piezoelectric body later.

2. A manufacturing method for a thin board-shaped fired piezoelectric body according to claim 1,
   wherein the ratio T/L is 0.001 to 0.06.

3. A manufacturing method for a thin board-shaped fired piezoelectric body according to claim 1,
   where the reinforcing members for firing are scattered on the at least on-one surface of the green sheet to be symmetrical about a point.

4. A manufacturing method for a thin board-shaped fired piezoelectric body according to claim 3,
   wherein the reinforcing members for firing have a shape where a continued lattice shape is segmentalized to remove parts and are scattered on the at least on one surface of the green sheet.

5. A manufacturing method for a thin board-shaped fired piezoelectric body according to claim 3,
   wherein the reinforcing members for firing are formed by screen printing to dispose the reinforcing members for firing on the at least on-one surface of the green sheet.

6. A manufacturing method for a thin board-shaped fired piezoelectric body according to claim 3,
   wherein, after the reinforcing members for firing are scattered and disposed on a reinforcing plate for firing which is thicker than the green sheet in advance, the surface having the reinforcing members for firing disposed on the reinforcing plate for firing is bonded to the green sheet to dispose the reinforcing members for firing on the at least on one surface of the green sheet.

7. A manufacturing method for a thin board-shaped fired piezoelectric body according to claim 3,
wherein the reinforcing members for firing are thicker than the green sheet.

8. A manufacturing method for a thin board-shaped fired piezoelectric body according to claim 3,
wherein, after the step of obtaining the thin board-shaped fired piezoelectric body with the reinforcing members for firing, the method has a step of obtaining the thin board-shaped fired piezoelectric body by removing the reinforcing members for firing from the thin board-shaped fired piezoelectric body with the reinforcing members for firing by cutting, and
wherein the cutting method is one selected from a cutting means of a grinding stone method, a water jet method, an etching method, and a sandblasting method.

9. A manufacturing method for a thin board-shaped fired piezoelectric body according to claim 1,
wherein the reinforcing members for firing have a shape where a continued lattice shape is segmentalized to remove parts and are scattered on the at least on-one surface of the green sheet.

10. A manufacturing method for a thin board-shaped fired piezoelectric body according to claim 9,
wherein the reinforcing members for firing are formed by screen printing to dispose the reinforcing members for firing on the at least one surface of the green sheet.

11. A manufacturing method for a thin board-shaped fired piezoelectric body according to claim 9,
wherein, after the reinforcing members for firing are scattered and disposed on a reinforcing plate for firing which is thicker than the green sheet in advance, the surface having the reinforcing members for firing disposed on the reinforcing plate for firing is bonded to the green sheet to dispose the reinforcing members for firing on the at least one surface of the green sheet.

12. A manufacturing method for a thin board-shaped fired piezoelectric body according to claim 9,
wherein the reinforcing members for firing are thicker than the green sheet.

13. A manufacturing method for a thin hoard-shaped fired piezoelectric body according to claim 9,
wherein, after the step of obtaining the thin board-shaped fired piezoelectric body with the reinforcing members for firing, the method has a step of obtaining the thin board-shaped fired piezoelectric body by removing the reinforcing members for firing from the thin board-shaped fired piezoelectric body with the reinforcing members for firing by cutting, and
wherein the cutting method is one selected from the cutting means consisting of a grinding stone method, a water jet method, an etching method, and a sandblasting method.

14. A manufacturing method for a thin board-shaped fired piezoelectric body according to claim 1,
wherein the reinforcing members for firing are formed by screen printing to dispose the reinforcing members for firing on the at least on one surface of the green sheet.

15. A manufacturing method for a thin board-shaped fired piezoelectric body according to claim 1,
wherein, after the reinforcing members for firing are scattered and disposed on a reinforcing plate for firing which is thicker than the green sheet in advance, the surface having the reinforcing members for firing disposed on the reinforcing plate for firing is bonded to the green sheet to dispose the reinforcing members for firing on the at least one surface of the green sheet.

16. A manufacturing method for a thin board-shaped fired piezoelectric body according to claim 1,
wherein the reinforcing members for firing are thicker than the green sheet.

17. A manufacturing method for a thin board-shaped fired piezoelectric body according to claim 1,
wherein, after the step of obtaining the thin board-shaped fired piezoelectric body with the reinforcing members for firing, the method has a step of obtaining the thin board-shaped fired piezoelectric body by removing the reinforcing members for firing from the thin board-shaped fired piezoelectric body with the reinforcing members for firing by cutting, and
wherein the cutting method is one selected from a cutting means of a grinding stone method, a water jet method, an etching method, and a sandblasting method.

18. A manufacturing method for a thin board-shaped fired piezoelectric body according to claim 1, wherein the reinforcing members for firing have one of a shape that is cross-shaped, a shape of two connected crosses, and a circular shape.

19. A manufacturing method for a piezoelectric element, the method comprising:
a step of manufacturing, using a piezoelectric material, a green sheet having a ratio T/L of 0.000002 to 0.2, where T is the thickness and L is the maximum length within a surface of the green sheet after firing;
a step of obtaining the thin board-shaped fired piezoelectric body with reinforcing members for firing by the firing of the green sheet with the reinforcing members for tiring on at least one surface of the green sheet after disposing the individual reinforcing members for firing by scattering on the at least one surface of the green sheet so as to exclude areas to be the thin board-shaped fired piezoelectric body later; and
a step of forming a membrane-shaped electrode in areas to be the thin board-shaped fired piezoelectric body later in the thin board-shaped fired piezoelectric body with the reinforcing members for firing.

20. A manufacturing method for a piezoelectric element according to claim 19,
wherein the membrane-shaped electrode is formed by a method selected from the membrane formation means consisting of a spin coat method, a sputtering method, a dipping method, and a non-contact application method.

21. A manufacturing method for a piezoelectric element according to claim 19,
wherein the method has a step of obtaining the piezoelectric element by removing the reinforcing members for firing from the thin board-shaped fired piezoelectric body with the reinforcing members for firing having a membrane-shaped electrode formed thereon by cutting, and
wherein the cutting method is one selected from a cutting means of a grinding stone method, a water jet method, an etching method, and a sandblasting method.

22. A manufacturing method for a piezoelectric element according to claim 19, wherein the reinforcing members for firing have one of a shape that is cross-shaped, a shape of two connected crosses, and a circular shape.

* * * * *